(12) United States Patent
Mitani

(10) Patent No.: US 7,601,613 B2
(45) Date of Patent: Oct. 13, 2009

(54) MANUFACTURING METHOD OF BONDED WAFER

(75) Inventor: Kiyoshi Mitani, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 288 days.

(21) Appl. No.: 11/629,074

(22) PCT Filed: Jun. 6, 2005

(86) PCT No.: PCT/JP2005/010648

§ 371 (c)(1),
(2), (4) Date: Dec. 11, 2006

(87) PCT Pub. No.: WO2005/124865

PCT Pub. Date: Dec. 29, 2005

(65) Prior Publication Data

US 2008/0286937 A1 Nov. 20, 2008

(30) Foreign Application Priority Data

Jun. 17, 2004 (JP) ............................. 2004-179373

(51) Int. Cl.
*H01L 21/30* (2006.01)
(52) U.S. Cl. ...................... 438/455; 438/458
(58) Field of Classification Search ................. 438/455, 438/458
See application file for complete search history.

(56) References Cited

U.S. PATENT DOCUMENTS

| 5,374,564 A | 12/1994 | Bruel |
| 6,746,559 B2 * | 6/2004 | Ohmi et al. ................. 156/239 |
| 6,900,113 B2 * | 5/2005 | Nakano et al. .............. 438/455 |
| 7,229,899 B2 * | 6/2007 | Moriceau et al. ............ 438/458 |
| 2006/0040469 A1 | 2/2006 | Aga et al. |

FOREIGN PATENT DOCUMENTS

| JP | 3048201 | 3/2000 |
| JP | 2004-63730 | 2/2004 |

* cited by examiner

*Primary Examiner*—Matthew C Landau
*Assistant Examiner*—Jessica Hall
(74) *Attorney, Agent, or Firm*—Oliff & Berridge, PLC

(57) ABSTRACT

In a first ion implantation step (a1), a delamination-intended ion implantation layer 3 is formed by implanting ions at a dosage less than a critical dosage from the insulating film 2 side of a bond wafer 1. In an additional function layer deposition step (b2), an additional function layer 4 is deposited on the insulating film 2 of the bond wafer 1. In a second ion implantation step (c1), by implanting ions at a dosage, the delamination-intended ion implantation layer 3 is matured into a delamination ion implantation layer 3'. Thereby, the delamination ion implantation layer is formed by two steps of ion implantation having the additional function layer deposition step therebetween, and therefore non-uniformity of the additional function layer does not influence uniformity of a film thickness of a bonded semiconductor thin layer.

19 Claims, 3 Drawing Sheets

Example 1

(a1) first ion implantation
(less than a critical dosage)

(b1) deposition of additional function layer (c1) second ion implantation (d1) planarization polishing
(non-uniformity of film thickness of additional function layer)

(e1) bonding (f1) delamination
(uniform film thickness of SOI layer)

Example 2

(a2) first ion implantation
(less than a critical dosage)

(b2) deposition of additional function layer (c2) second ion implantation (d2) planarization polishing
(non-uniformity of film thickness of additional function layer)

(e2) bonding (f2) delamination
(uniform film thickness of SOI layer)

FIG.3   reference art
(a) deposition of additional function layer
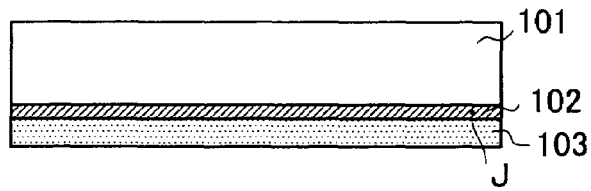
(b) planarization polishing (non-uniformity of film thickness of additional function layer)
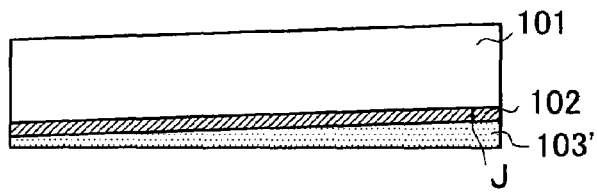
(c) ion implantation
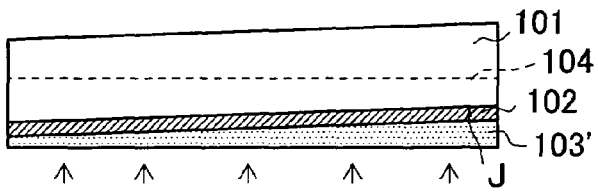
(d) bonding
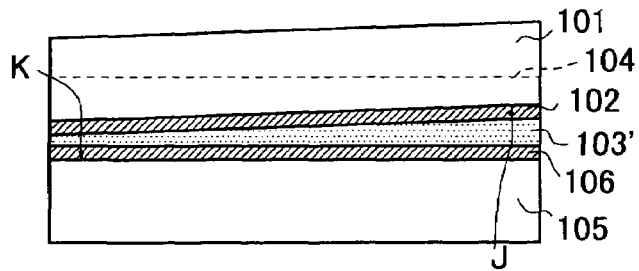
(e) delamination (non-uniform film thickness of SOI layer)
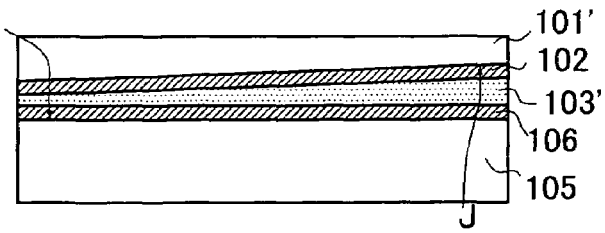

MANUFACTURING METHOD OF BONDED WAFER

RELATED APPLICATIONS

This application claims the priorities of Japanese Patent Application No. 2004-179373 filed on Jun. 17, 2004, which is incorporated herein by reference.

BACKGROUND OF THIS INVENTION

1. Field of this Invention

This invention relates to a manufacturing method of a bonded wafer, and in particular, to a manufacturing method of a bonded wafer using an ion implantation delamination method.

2. Description of the Related Art

An ion implantation delamination method has been known as a manufacturing method of SOI (Silicon On Insulator) wafer, which is an example of the manufacturing method of a bonded wafer. This method is performed in this way: hydrogen is ion implanted on a bonding surface (hereinafter, referred to as a first main surface) of a bond wafer so that a delamination ion implantation layer, which is a high concentration hydrogen layer, is formed at a predetermined depth, a base wafer is bonded to the first main surface and thereafter, the bond wafer is delaminated off at the delamination ion implantation layer, which is also referred to as a Smart-Cut process ("Smart Cut" is a registered trade mark): (for example, see JP No. 3048201). On the other hand, it is actually enabled to insert, a polysilicon layer or an amorphous silicon layer as an additional function layer right under or right over of an buried oxide film of an SOI wafer for, for example, heavy metal gettering. In order to incorporate the additional function layer in the process of the ion implantation delamination method, it is thought that the following change in the process is necessary. That is, after a buried oxide layer is formed on the bond wafer side, an additional function layer is further formed by a chemical vapor deposition (CVD for short) method or the like. Then, hydrogen is ion implanted so that hydrogen reaches into the bonded wafer from the additional function layer side to form the delamination ion implantation layer. Next, the additional function layer on the bonded wafer is bonded to a base wafer, the bond wafer is delaminated off at the delamination ion implantation layer to thereby obtain an SOI layer as a remaining bonded semiconductor thin layer.

Since, in an ion implantation delamination method, the following technique has been known on a dosage of ion implantation for delamination in a bond wafer. That is, energy of ion implantation has to be adjusted in order to regulate a position (depth) of formation of an delamination ion implantation layer from the first main surface, depending on a required film thickness of an SOI layer. With a shallower position of formation of the delamination ion implantation layer, a critical dosage required for delamination is smaller. On the other hand, a surface roughness of a delamination surface is affected by a dosage of ion implantation and with a smaller dosage, a surface roughness of the delamination surface is smaller. Therefore, in a case where a position of formation of a delamination ion implantation layer is shallower, a dosage of ion implantation is set lower; with a smaller dosage of ion implantation, a surface roughness is also smaller and if a thin SOI layer is formed, film thickness uniformity of the SOI layer is improved (for example, see page 4 of JP-A 2004-63730).

In a manufacturing method of a bonded wafer, in which a manufacturing method of the SOI wafer is described as an example, necessity arises for polishing for planarization of a surface of an additional function layer in order to perform good bonding to a base wafer in a case where an additional function layer is incorporated. If inclination occurs on a polished surface of the additional function layer in the planarization polishing, a film thickness of the additional function layer is uneven and a depth of a hydrogen ion implantation into a bond wafer is adversely affected by the non-uniformity of the film thickness of the additional function layer and a problem arises that leads to non-uniformity of a film thickness of a bonded semiconductor thin film (equivalent to an SOI layer) obtained by ion implantation delamination.

In addition, ion implantation of hydrogen is applied from the additional function layer side into a bond wafer; therefore, a problem arises that leads to an adverse influence of a surface roughness of a polished surface of an additional function layer exerted on a surface roughness of a delamination surface of a delamination ion implantation layer.

Furthermore, ion implantation of hydrogen is applied through an additional function layer, which leads to a problem that the ion implantation requires a great amount of energy. Hence, a depth of a delamination ion implantation layer is limited to a position not relatively deep in a bond wafer: it is difficult to form the ion implantation layer at a position equal to or deeper than, for example, 1 μm from a polished surface of the additional function layer.

A method to solve the problems is that an additional function layer is deposited on a base wafer side and the layer is bonded to a bond wafer with an oxide film interposed therebetween. With such a method adopted, however, since a bonding surface is closer to an SOI layer, in which a device is fabricated, new problems arise such that an impurity incorporated onto a bonding interface adversely affects a device layer, and that in a case where a thin buried oxide film (for example, 100 nm or less) is required, poor bonding is easy to occur since a surface of the thin oxide film is used as the bonding surface, leading to degradation of a manufacturing yield.

As another solution, a method has been available that hydrogen ion implantation is performed before an additional function layer is deposited on the bond wafer side, however since growth temperature required for deposition of an additional function layer is usually 400° C. or higher, another problem arises that delamination occurs during deposition in the vicinity of the surface of a wafer.

It is a first object of this invention to provide a manufacturing method of a bonded wafer that by conducting two steps of ion implantation forming a delamination ion implantation layer, having a deposition step of an additional function layer therebetween, no adverse influence of non-uniformity of a film thickness of an additional function layer, if it occurs, acts on uniformity of a film thickness of a bonded semiconductor thin layer.

It is a second object of this invention to provide a manufacturing method of a bonded wafer that can form a delamination ion implantation layer with small energy at a more precise position.

It is a third object of this invention to provide a manufacturing method of a bonded wafer that can reduce a surface roughness of the delamination surface of a delamination ion implantation layer.

SUMMARY OF THIS INVENTION

A first aspect of the manufacturing method of a bond wafer, in order to solve the above objects, includes: a first ion implantation step of conducting first ion implantation on a bond wafer so that a concentration peak of ion implantation is located at a position with a predetermined depth in an ion implantation profile in the depth direction; an additional-function layer deposition step of depositing an additional function layer on the ion implantation surface side of the bond wafer; a second ion implantation step of conducting second ion implantation with the first ion implantation position as a target from the additional function layer side of the bond wafer; a bonding step of bonding the additional function layer side of the bonded wafer to a base wafer; and a delamination step of separating the bonded wafer off at the position of the first ion implantation. The first aspect of the manufacturing method of a bond wafer is basically an application of the principle of the ion implantation delamination method, in which one step of ion implantation for delamination in a conventional ion implantation delamination method is replaced by two steps of ion implantation, having the deposition of the additional function layer therebetween. Firstly, the first ion implantation is applied on the bond wafer so that the concentration peak of ion implantation is located at a position having a predetermined depth in an ion implantation profile in the depth direction and then, after the deposition of the additional function layer, the second ion implantation is conducted with the position of the first ion implantation as a target. Since the first ion implantation is applied in a state of no deposition of the additional function layer, no adverse influence acts on uniformity of an SOI layer even if non-uniformity of the additional function layer occurs.

A second aspect of the manufacturing method of a bonded wafer adopts, as the first ion implantation, an ion implantation dosage with which no cracking occurs in the bond wafer in the course of a thermal history in growth of the additional function layer. Hence, an inconvenience, that the bond wafer is delaminated off in the additional function layer deposition step, can be prevented.

A third aspect of the manufacturing method of a bonded wafer includes: a first ion implantation step of forming a delamination-intended ion implantation layer having the concentration peak of ion implantation at a position having a predetermined depth in an ion implantation profile in the depth direction in the bond wafer by implanting ions at a dosage less than a critical dosage from the insulating film side of the bond wafer which is a single crystal silicon substrate with an insulating film formed thereon; an additional function layer deposition step of depositing an additional function layer on the insulating film of the bond wafer; a second ion implantation step of forming a delamination ion implantation layer from the delamination-intended ion implantation layer by implanting ions at a dosage with which a total dosage to more than a critical dosage including the dosage of ion implantation in the first ion implantation step so that ion implantation is conducted at the same position of depth of ion implantation as in the first ion implantation step from the surface side of the additional function layer; a bonding step of bonding the additional function layer on the bond wafer in which the delamination ion implantation layer is formed to a base wafer; and a delamination step of separating the bond wafer off at the delamination ion implantation layer. Herein, a critical dosage is the lowest dosage necessary to produce a cavity called a blister at a temperature of 400° C. or higher in the ion implantation layer of the bond wafer that has been ion implanted. Usually, no delamination occurs at a ion implantation layer in a bonded wafer produced by bonding a bond wafer irradiated with a ion implantation dosage less the critical dosage to a base wafer, and heat treating the bonded wafer. The third aspect of the manufacturing method of a bonded wafer is basically an application of the principle of the ion implantation delamination method, in which one step of ion implantation to form a delamination ion implantation layer in a conventional ion implantation delamination method is replaced by two steps of ion implantation, having the deposition of the additional function layer therebetween. By adopting such a process, in the first ion implantation step, a delamination-intended ion implantation layer can be precisely formed at a deeper position in a bond wafer from the surface of an additional function layer with less energy, and by maturing the delamination-intended ion implantation layer into a delamination ion implantation layer in the second ion implantation step, precise and certain delamination can be realized at a deeper position in the bond wafer from the surface of the additional function layer. Especially, since a delamination-intended ion implantation layer is formed in a state where no additional function layer is deposited, a delamination surface of a bond wafer is located at a predetermined position of depth from the first main surface of the bond wafer and uniformity of a film thickness of a bonded semiconductor thin layer can be maintained without adverse influence of non-uniformity of a film thickness of an additional function layer.

A forth aspect of the manufacturing method of a bonded wafer uses a dosage of ion implantation in the first ion implantation step larger than a dosage of ion implantation in the second ion implantation step. Thereby, since ions ion implanted in the second ion implantation step is trapped or attracted into a delamination-intended ion implantation layer formed by ion implantation in the first ion implantation step to form a delamination ion implantation layer, the delamination surface of the bonded wafer is specifically determined at a position having the delamination-intended ion implantation layer formed in the first ion implantation step.

A fifth aspect of the manufacturing method of a bonded wafer uses a dosage of ion implantation in the first ion implantation, that is in the range of 70% or more and 90% or less of the critical dosage. As has been described, as a precondition, the dosage of ion implantation in the first ion implantation step is larger than that in the second ion implantation step, whereas if both values are excessively close to each other, a risk arises that a delamination-intended ion implantation layer formed in the first ion implantation is forced to be attracted to a position to which ion implantation is conducted in the second ion implantation step. Therefore, a dosage of ion implantation in the first ion implantation step is adjusted in the range of 70% or more and 90% or less of the critical dosage, that is: at about 80%, in which condition it is effective that a delamination-intended ion implantation layer is not attracted into a position of ion implantation in the second ion implantation step. If the sum of a dosage of ion implantation in the first ion implantation and that in the second ion implantation ranges approximately from 100% to 110% of a critical dosage, a difference is desirably 30% or more of the critical dosage between a dosage of ion implantation in the first ion implantation and that in the second ion implantation.

A sixth aspect of the manufacturing method of a bonded wafer includes a planarization polishing step before or after the second ion implantation step in which step the surface of the deposited additional function layer is planarized by polishing. Since the surface of the additional function layer is polished into a polished surface by the planarization polishing step, a bond wafer having an additional function layer can be bonded well to a base wafer in a subsequent bonding step.

A seventh aspect of the manufacturing method of a bonded wafer includes: an activation step of activating surfaces of the bond wafer and/or the base wafer with a plasma before the bonding step. Since a bonding strength between wafers increases at room temperature by applying the activation step, delamination at the delamination ion implantation layer is enabled by a physical or mechanical method without an annealing dedicated to delamination.

A eighth aspect of the manufacturing method of a bonded wafer includes the delamination step that is a step of conducting delamination by blowing water laser or gas to the bond wafer after the activation step. In the delamination step, since surface activation for a bond wafer is conducted in the preceding activation step, delamination can be realized only by blowing water laser (water jet) jetting high pressure water from a narrow nozzle or a high pressure gas to a bond wafer.

A ninth aspect of the manufacturing method of a bonded wafer includes a step of conducting delamination by heat treating the bond wafer in the delamination step. In the delamination step, delamination of the bond wafer is conducted at a delamination ion implantation layer by an annealing.

A tenth aspect of the manufacturing method of a bonded wafer uses the insulating film, which is one selected from a silicon oxide film, a silicon nitride film and a silicon oxide nitride film. It is needless to say that an insulating film can be easily formed by thermal oxidation or the like of a bond wafer, whereas there is a case where a sufficient characteristic cannot be obtained with a silicon oxide film in some device formed in a bonded semiconductor thin layer. In such a case, a method such as CVD or the like can be used to form an insulating film, which is made of a silicon oxide, a silicon nitride or a silicon oxide nitride or the like.

An eleventh aspect of the manufacturing method of a bonded wafer uses the additional function layer, which is made of a polysilicon layer or an amorphous silicon layer. In a case where an additional function layer is used as a gettering layer, a polysilicon layer or an amorphous silicon layer has conventionally adopted.

A twelfth aspect of the manufacturing method of a bonded wafer uses, as the ion, one selected from a hydrogen ion, a helium ion, a neon ion, an argon ion, a krypton ion and a xenon ion. While, mainly, hydrogen ions are used as ions for ion implantation in the ion implantation delamination method, inactive gas ions such as He, Ne, Ar, Kr, or Xe are also used.

A thirteenth aspect of the manufacturing method of a bonded wafer uses, as the base wafer, one selected from a single silicon substrate with an insulating film, a single crystal silicon substrate, an insulating substrate and a compound semiconductor substrate. A base wafer can be appropriately selected from a single silicon substrate with an insulating film, a single crystal silicon substrate, insulating substrates such as a quartz substrate and a sapphire substrate, and substrates of compound semiconductors such as GaAs, InP and SiC, depending on conditions of a device formed on the bonded semiconductor thin layer, film thickness of the insulator film, layer thickness of the additional function layer or the like.

BRIEF DESCRIPTION OF THE DRAWINGS

FIG. 3 is process views describing a manufacturing method of a bonded wafer in a reference art with a manufacturing method of an SOI wafer as an example.

DETAILED DESCRIPTION OF THE PREFERRED EMBODIMENTS

Figure 1:
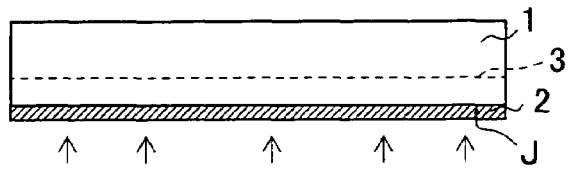
FIG. 1 is process views describing a manufacturing method of a bonded wafer related to Example 1 of this invention with a manufacturing method of an SOI wafer as an example.
Figure 1:
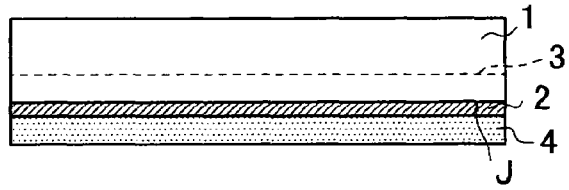
Figure 1:
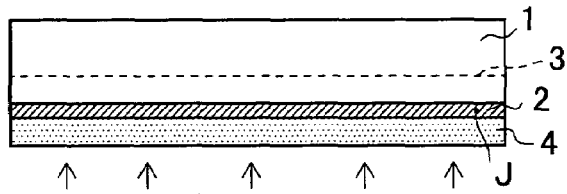
Figure 1:
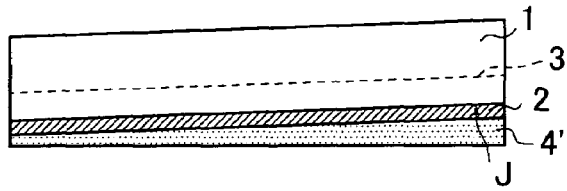
Figure 1:
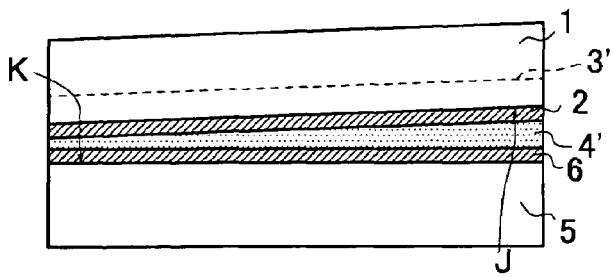
Figure 1:
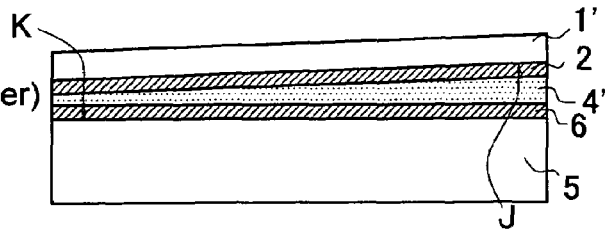

By dividing an ion implanting step for forming a delamination ion implantation layer into two steps of ion implantation having a deposition step for an additional function layer therebetween, an adverse influence of non-uniformity of a film thickness of the additional function layer is prevented from acting on uniformity of a film thickness of a bonded semiconductor thin layer.

First of all, prior to the start of description of examples of this invention, description will be given of the reason for non-uniformity of a film thickness of a bonded semiconductor thin layer in the manufacturing method of a bonded wafer having the additional function layer with a manufacturing method of an SOI wafer shown in FIG. 3 in a reference art as an example.

(a) Polysilicon Layer Deposition Step

A bond wafer 101, which is a single crystal substrate, is prepared. Then, an insulating film 102 made of a silicon oxide film is formed on the side of at least the bonding surface (hereinafter referred to as a first main surface) J side of the bond wafer 101. While the insulating film 102 can be formed by thermal oxidation such as wet oxidation or dry oxidation, a method such as a CVD method can also be adopted. A film thickness of the insulating film 102 is, for example, in the range of 2 nm or more and 1 µm or less. Note that the insulation film 102 can also be formed with a silicon nitride film or a silicon oxide nitride film instead of a silicon oxide film. Then, an additional function layer 103 made of a polysilicon layer is deposited on the insulating film 102 formed on the bond wafer 101 by a CVD method. A film thickness of the additional function layer 103 ranges approximately from 100 to 1000 nm. The additional function layer 103 is formed by one of two kinds of methods, that is: a batch type and a single-wafer-processing-type, wherein uniformity of a film thickness in the batch type is approximately +/−5% in the wafer and +/−10% in the batch. The growth temperature of the additional function layer 103 ranges approximately from 600 to 800° C.

(b) Planarization Polishing Step

Since a surface of the additional function layer 103 is rough, it is difficult to bond to a base wafer 105 (see FIG. 3(d)). Hence, planarization polishing is applied, by CMP (Chemical Mechanical Planarization) polishing, to the surface of the additional function layer 103 (with a surface roughness rms (root mean square) of less than 0.2 nm/1 µm$^2$) so as turned to be the additional function layer 103' with a polished surface. A stock removal in the polishing ranges approximately from 20 to 200 nm. In a case with a polishing stock removal of 100 nm, a variation of polishing stock removal is approximately +/−5 nm on the wafer. Non-uniformity of a film thickness of the additional function layer 103' increases, as compared with that before the planarization polishing by applying the planarization polishing to the additional function layer 103. In FIG. 3(b), there is shown a state where non-uniformity of a film thickness of the additional function layer 103' is increased as an example. Note that, herein, while description is given of non-uniformity of a film thickness of the additional function layer 103' by applying planarization polishing, non-uniformity of a film thickness of the additional function layer 103' is not necessarily caused only by the planarization polishing. That is, there is a case where non-uniformity of a film thickness thereof occurs naturally in a step of depositing the additional function layer 103.

(c) Ion Implantation Step

Since delamination is conducted in the bond wafer 101, a delamination ion implantation layer 104 that has the concentration peak at a position having a predetermined depth in an ion implantation profile in the depth direction is formed by implanting hydrogen ion into the bond wafer 101 from the polished surface (the first main surface J) side of the additional function layer 103'. Since a variation of a depth of implantation of hydrogen ions is approximately +/−1 nm on the wafer, a depth of implantation of hydrogen ions in the bond wafer 101 depends on film thickness non-uniformity of the addition function layer 103' located on the way to the depth of the bond wafer 101. In FIG. 3(c), there is shown, as an example, a state where a delamination ion implantation layer 104 is formed at positions of non-constant depth along the layer from the first main surface J of the bond wafer 101 because of non-uniformity of a film thickness of the addition functional layer 103' though the delamination ion implantation layer 104 is located at a constant depth along the polished surface of the additional function layer 103'. That is, in this state, no parallelism is established between the first main surface J of the bond wafer 101 and the delamination ion implantation layer 104, resulting in non-uniformity of film thickness of an SOI layer 101' (see FIG. 3(e)) to be finally obtained.

(d) Bonding Step

A base wafer 105, which is a single crystal silicon substrate, is prepared. As the base wafer 105, different kinds of substrates can also be used: for example, an insulating substrate such as a quartz substrate or a sapphire substrate, or alternatively, a compound semiconductor substrate such as a substrate of GaAs, InP or SiC, while it is preferable to use a single crystal silicon substrate in consideration of the trend toward a larger diameter and a lower cost. Then, an insulating film 106 made of a silicon oxide film is formed at least on the bonding surface K (hereinafter referred to as the first main surface) of the base wafer 105. While the insulating film 106 can be formed by thermal oxidation: for example, wet oxidation or dry oxidation, a method such as a CVD method or the like can also be adopted. The base wafer 105 with the insulating film 106 that has been thus prepared is bonded at room temperature to the additional function layer 103' on the bond wafer 101 on which ion implantation is applied on the insulating film 106 (the first main surface K) side.

(e) Delamination Step

The stack obtained in the bonding step (d) is heated to a temperature of 500° C. or higher to force delamination in the bond wafer 101 at the delamination ion implantation layer 104 into which hydrogen ions have been implanted to thereby form an SOI layer 101'. In FIG. 3(e), there is shown, as example, a state where non-uniformity of a film thickness occurs in the SOI layer 101' as well, since delamination is conducted at the delamination ion layer 104 formed at positions of non-constant depth along the layer from the first main surface J of the bond wafer 101 because of non-uniformity of a film thickness of the additional function layer 103'.

Note that another process may be applied: in which in the bonding step (d) and the delamination step (e), bonding is conducted after activation with a plasma of the surface of the additional function layer 103' of the bond wafer 101 and/or the surface of the insulating film 106 of the base wafer 105, and thereafter, water laser or gas is blown onto the bond wafer 101 without heating to thereby conduct delamination in the bond wafer 101 at the delamination ion implantation layer 104.

In such a way, since, in the manufacturing method of a bonded wafer having the additional function layer in the above described reference art, only one step of ion implantation is applied so as to form the delamination ion implantation 104, a problem arises that a film thickness of the SOI layer 101' is not uniform due to non-uniformity of a film thickness of the additional function layer 103', that a surface roughness of the polished surface of the additional function layer 103' affects a surface roughness of the delaminated surface of the delamination ion implantation layer 104 and that a great amount of energy is required in implantation of hydrogen ions.

Then, detailed description will be given of examples of this invention, which has an object to solve the problems in the above described reference art, with reference to the accompanying drawings.

Example 1

In FIG. 1, there are shown process views describing a manufacturing method of a bonded wafer related to Example 1 of this invention with a manufacturing method of an SOI wafer as an example. Description will be given below of the manufacturing method of a bonded wafer related to Example 1 with reference to the figure.

(a1) First Ion Implantation Step

A bond wafer 1, which is a single crystal silicon substrate, is prepared and an insulating film 2 made of a silicon oxide film is formed at least on the first main surface J side of the bond wafer 1. Note that the insulating film 2 can also be formed with a silicon nitride film or a silicon oxide nitride film instead of a silicon oxide film. While the insulating film 2 can be formed by thermal oxidation: for example, wet oxidation or dry oxidation, a method such as a CVD method or the like can also be adopted. A film thickness of the insulating film 2 is, for example, a value in the range of 2 nm or more and 1 μm or less.

Then, hydrogen ions are implanted on the first main surface J side of the bond wafer 1 with the surface of the insulating film 2 as an ion implantation surface in Example 1 at a dosage less than a critical dosage, for example, by irradiation with a hydrogen ion beam to thereby form a delamination-intended ion implantation layer 3 having the concentration peak at a position having a predetermined depth in an ion implantation profile in the depth direction. The delamination-intended ion implantation layer 3 is formed at a position having a given constant depth from the first main surface J as shown in FIG. 1(a1). That is, the delamination-intended ion implantation layer 3 is formed parallel to the first main surface J in order to assure uniformity of a film thickness of the SOI layer 1'(see FIG. 1(f1)) to be finally obtained. A dosage of implanted hydrogen ions is maintained at a appropriately low level as compared with the critical dosage.

A standard is about 80% of the critical dosage, which is the lowest dosage at which a blister occurs in the vicinity of the a wafer surface, when a temperature of the bond wafer 1 is raised to 400° C. or higher after hydrogen ion implantation. Thereby, a delamination position in the bond wafer 1 in a delamination step (f1) at a subsequent stage is determined by a depth position of the delamination-intended ion implantation layer 3, however it does not proceed as far as delamination to occur. Note that while ions used for forming the delamination-intended ion implantation layer 3 are hydrogen ions in Example 1, ions of other inert gas can also be used instead of hydrogen, such as helium, neon, argon, krypton and xenon.

The delamination-intended ion implantation layer 3 is preferably formed so that the peak position of a hydrogen concentration in the depth direction of the bond wafer 1 is located at a position in the range of 100 nm or more and 2000 nm or less in the hydrogen concentration profile in the depth direction of the bond wafer 1. If the depth position is less than 100 nm, the SOI layer 1' with a sufficient film thickness (see FIG. 1(f1)) cannot be obtained, and if the depth position is more than 2000 nm, extremely high energy irradiation is required in an ion implantation apparatus. For example, in a case where an average film thickness of an SOI layer 1' to be finally obtained is set to a value approximately in the range from 10 to 50 nm, a delamination-intended ion implantation layer 3 is preferably formed so that the peak position of a hydrogen concentration occurs at a position in the range of 100 to 500 nm (wherein in a case where the insulating film 2 is formed on the surface, a depth position is expressed excluding the insulating layer 2) in the profile of a hydrogen concentration in the depth direction of the bond wafer 1. Note that a depth of ion implantation is adjusted by energy of ions (an acceleration voltage) and, for example, in a case where hydrogen ions are used, energy of ion implantation for forming the delamination-intended ion implantation layer 3 is preferably set approximately ranging from 10 k to 60 keV with a film thickness of the insulating film 2 of 50 nm set.

In order to conduct smooth and flat delamination at the delamination-intended ion implantation layer 3, that is the delamination ion implantation layer 3' (see FIG. 1(d1)) described later, the sum of the dosages of hydrogen ion implantation is desirably in the range of $2 \times 10^{16}$ counts/cm$^2$ to $1 \times 10^{17}$ counts/cm$^2$. If the dosage is less than $2 \times 10^{16}$ counts, normal delamination is disabled and if the dosage exceeds $1 \times 10^{17}$ counts/cm$^2$, the step takes a long time, which leads to lowering of a manufacturing efficiency with unavoidable difficulty because of extremely large amount of an ion dosage.

Note that, as has been described, as a position of formation of the delamination-intended ion implantation is shallower, a critical dosage of ion implantation necessary for delamination is set to a lower value. In a case where a film thickness of the insulating film 2 is a given value, a position of the delamination-intended implantation layer 3 formed is shallower with a smaller film thickness of the SOI layer 1' to be finally obtained and thereby a dosage of ion implantation is set to a smaller value depending on the film thickness. Therefore, the delamination surface of the SOI layer 1' to be obtained with a smaller dosage has a decreased surface roughness and a polishing stock removal can be set to a smaller value in the planarization processing for the delamination surface. As a result, with a smaller film thickness of the SOI layer 1', a polishing stock removal is smaller, so as to suppress an influence of non-uniformity of a polishing stock removal, and uniformity of a film thickness on the bond wafer 1 of the SOI layer 1' and uniformity of a film thickness on a wafer to wafer basis can be sufficiently reduced. For example, in a case where an average film thickness of the SOI layer 1' is set approximately in the range from 10 to 50 nm as well, uniformity of film thickness of the SOI layer 1' can be assured to, for example, 1.2 nm or less in terms of a standard deviation of a film thickness on the wafer of the SOI layer 1'.

(b1) Additional Function Layer Deposition Step

An additional function layer 4 made of a polysilicon layer is deposited on the insulating film 2 of the bond wafer 1 by means of a CVD method at a temperature of 600° C. or higher. A film thickness of the additional function layer 4 ranges approximately from 100 to 1000 nm. Two kinds of types including a batch types and a single-wafer-processing-types have been available for deposition of the additional function layer 4, wherein, in the batch type, uniformity of a film thickness is approximately +/−5% on the wafer and approximately +/−10% in the batch. The growth temperature of the additional function layer 4 ranges approximately from 600 to 800° C. Note that the additional function layer 4 can also be formed with an amorphous silicon layer or the like instead of a polysilicon layer. While the growth temperature of the additional function layer 4 is 600° C. or higher, neither delamination nor a blister occurs in the delamination-intended ion implantation layer 3 since the dosage of hydrogen ions is less than or equal to a critical dosage. In the delamination-intended ion implantation layer 3, however, a case arises where a fine defect layer and a cracking layer can be formed depending on ion implantation into the delamination-intended ion implantation layer 3 and the growth temperature of the additional function layer 4.

(c1) Second Ion Implantation Step

By implanting ions at a total dosage that is more than or equal to a critical dosage, obtained by adding to the dosage of ion implantation applied in the first ion implantation step (a1), so that the ions are implanted at the position having the same depth of ion implantation in the first ion implantation step (a1) from the surface of the additional function layer 4 (that is, a position where the delamination-intended implantation layer 3 is formed), the delamination-intended ion implantation layer 3 is matured into the delamination ion implantation layer 3'. To be detailed, since the delamination-intended ion implantation layer 3 has the concentration peak at a position having a predetermined depth in the ion implantation profile in the depth direction, a stress field caused by ion implantation is easy to produce a potential in the shape of a valley and an attracting stress for hydrogen ions during the second ion implantation is also easy to be formed. Hence, hydrogen ions implanted in the second ion implantation step (c1) are trapped or attracted and then converged into the delamination-intended ion implantation 3. Since the delamination-intended ion implantation layer 3 already includes a fine defect layer and a cracking layer formed by the ion implantation in the first ion implantation step (a1) and a thermal history in growth of the addition function layer deposition step (b1), implanted hydrogen ions are trapped or attracted thereinto more strongly. Hence, if the sum of a dosage of ion implantation into the delamination-intended ion implantation layer 3 in the first ion implantation step (a1) and that in the second ion implantation step (c1) exceeds a critical dosage, the delamination-intended ion implantation layer 3 is matured into the delamination ion implantation layer 3' at which delamination is enabled.

(d1) Planarization Polishing Step

Since the surface of the additional function layer 4 is rough, it is hard to be bonded to a base wafer 5 (see FIG. 1(e1)), therefore the surface of the additional function layer 4 is planarized by CMP polishing (to a surface roughness rms of less than 0.2 nm/μm$^2$) into an additional function layer 4' having a polished surface acting as a bonding surface in a subsequent bonding step (e1). A polishing stock removal ranges approximately from 20 to 200 nm. In a case where a polishing stock removal is 100 nm, a variation of polishing stock removal is approximately +/−5 nm on the wafer. The polished surface of the additional function layer 4' may be inclined relative to the first main surface J by planarization of the addition function layer 4, so as to cause non-uniformity of a film thickness of the additional function layer 4'. In FIG.

1(*d*1), there is shown, as example, a state where non-uniformity of a film thickness occurs in such an additional function layer 4'.

Note that the second ion implantation step (c1) can also be conducted after the planarization polishing step (d1). In this case, the second ion implantation is applied through the additional function layer 4' having a variation of polishing stock removal due to planarization polishing, whereas ions implanted in the second ion implantation are, as described above, easy to be attracted into the delamination-intended ion implantation layer 3 already formed in the first ion implantation, so as to minimize an influence of the variation of polishing stock removal.

Needless to say that the sum of total energy consumed in the first ion implantation step (a1) and total energy consumed in the second ion implantation step (c1) is far smaller than a total energy consumed for formation of the delamination ion implantation layer 3' only in the second ion implantation step (c1). This is because a voltage at which ions are implanted in the delamination-intended ion implantation layer 3 without the use of the additional function layer 4 interposed in the first ion implantation step (a1) is lower than a voltage required to form a layer equivalent to the delamination-intended ion implantation layer 3 through the additional function layer 4 in the second ion implantation step (c1). Especially, in Example 1, since ions of about 80% of a critical dosage are implanted into the delamination-intended ion implantation layer 3 in the first ion implantation step (a1), the effect of lowering the sum of total energy is further emphasized. Hence, in Example 1, total energy required for ion implantation is greatly reduced as compared with that in a case of the reference art shown in FIG. 3.

(e1) Bonding Step

A base wafer 5, which is a single crystal silicon substrate, is prepared. As the base wafer 5, different kinds of substrates can also be used: for example, an insulating substrate such as a quartz substrate or a sapphire substrate, or alternatively, a compound semiconductor substrate such as a substrate of GaAs, InP or SiC, while it is preferable to use a single crystal silicon substrate as Example 1 in consideration of a trend toward a larger diameter and a lower cost. Then, an insulating film 6 made of a silicon oxide film is formed at least on the bonding surface (hereinafter referred to as the first main surface) K of the base wafer 5. While the insulating film 6 can be formed by thermal oxidation: for example, wet oxidation or dry oxidation, a method such as a CVD method or the like can also be adopted. The base wafer 5 with the insulating film 6 that has been thus prepared is bonded to the additional functional layer 4' on the bond wafer 1 on which ion implantation is applied on the insulating film 6 (the first main surface K) side at room temperature.

(f1) Delamination Step

The stack obtained in the bonding step (e1) is heated to a temperature of hundreds of ° C.: for example, a low temperature in the range of 400 to 600° C. to force delamination in the bond wafer 1 approximately at a position having the concentration peak in the delamination ion implantation layer 3' and to form an SOI layer 1' in a portion remaining on the base wafer 5 side. Since the delamination position is, as has been described, determined in the first ion implantation step (a1) as the delamination-intended ion implantation layer 3, the delamination position is not influenced by non-uniformity of a film thickness caused by the subsequent deposition of the additional function layer 4 and planarization polishing. In FIG. 1(*f*1), there is shown a state where a film thickness is uniform in the SOI layer 1' since the bond wafer 1 is delaminated at the delamination ion implantation layer 3' though a film thickness is non-uniform in the additional function layer 4'. Note that there is a case where a delaminating annealing can be omitted by increasing a dosage of ion implantation during formation of the delamination ion implantation layer 3'. A remaining portion of the bond wafer 1 after the delamination can be reused as a bond wafer or a base wafer after the delamination surface is repolished.

Note that the method that is described in the reference art may also be adopted as the bonding step (e1) and the delamination step (f1). That is, a construction may be adopted in which bonding is conducted after activation with a plasma of the surface of the additional function layer 4' of the bond wafer 1 and/or the surface of the insulating film 6 of the base wafer 5, which has been conducted before bonding, and thereafter, water laser or gas is blown onto the bond wafer 1 without heating to thereby conduct delamination.

In order to obtain an SOI wafer in a finalized form, it is necessary to apply a bonding annealing in which the base wafer 5 and the SOI layer 1' are firmly bonded to each other with the insulating films 2 and 6 and the additional function layer 4 interposed therebetween after the delamination step (f1). The bonding annealing is conducted in an oxidative atmosphere, an inert gas such as argon gas, nitrogen gas, or a mixed gas of the inert gases usually at a high temperature in the range of 1000° C. or higher and 1250° C. or lower. Note that an thermal oxidation can also conducted at a temperature (in the range of 700° C. or higher and 1000° C. or lower) lower than a temperature in the bonding annealing for protection of the surface of SOI layer 1' in advance of the bonding annealing.

The delamination surface of the SOI layer 1' or a planarized delamination surface of thereof by polishing can be further planarized to a greater degree by a planarization annealing. The planarization annealing can be conducted in an inert gas such as argon gas, hydrogen gas or a mixed gas thereof at a temperature in the range of 1100 to 1380° C. To be detailed, such a planarization annealing can be conducted in an annealing furnace of a heater heating type such as a general batch type vertical or horizontal furnace, which, in addition, can be implemented with a single wafer RTA (Rapid Thermal Anneal) apparatus completing an annealing for a time approximately in the range from several seconds to several minutes by a lamp heating and the like. The planarization annealing can also be conducted with an effect of the above described bonding annealing.

Moreover, for example, when the insulating film 2 formed on the bond wafer 1 having a constant film thickness results in a smaller film thickness of the SOI layer 1' to be obtained, it is allowed to set a dosage of ion implantation to a smaller value depending on the film thickness, and also set polishing stock removal on the delamination surface of the SOI layer 1' in the polishing treatment to a smaller value. That is, with a thinner SOI layer 1', a position of formation of the delamination ion implantation layer 3 is shallower; therefore, a dosage of ion implantation is reduced and a polishing stock removal can be smaller in the delamination surface planarization, thereby enabling alleviating an adverse influence of non-uniformity of polishing stock removal. As a result, despite a film thickness of the SOI layer 1' is thin, both of non-uniformity of a film thickness on the bond wafer 1 and that between wafers can be alleviated to a sufficiently low level.

By the manufacturing method of a bonded wafer related to Example 1, a film thickness of the bonded semiconductor thin layer (SOI layer 1') obtained by ion implantation delamination can be made uniform, as has been described above, regardless of non-uniformity of a film thickness of the additional function layer 4'.

Example 2

Figure 2:
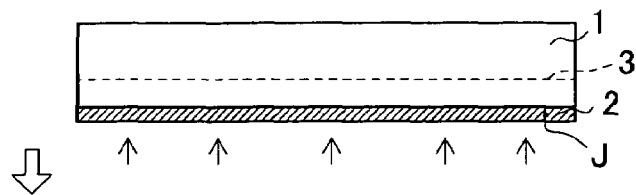
FIG. 2 is process views describing a manufacturing method of a bonded wafer related to Example 2 of this invention with a manufacturing method of an SOI wafer as an example.
Figure 2:
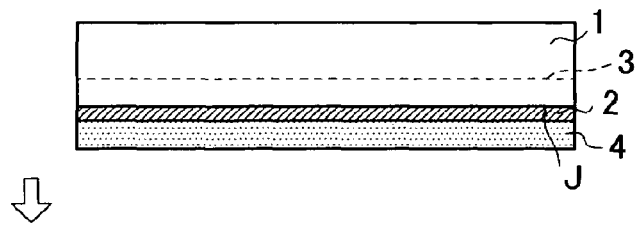
Figure 2:
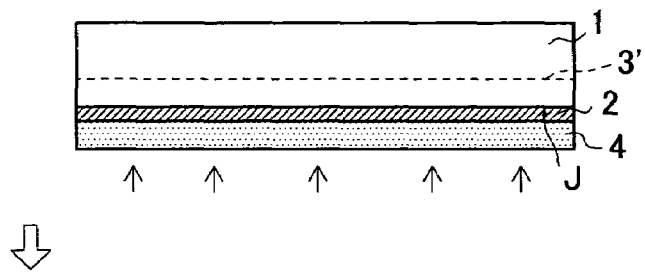
Figure 2:
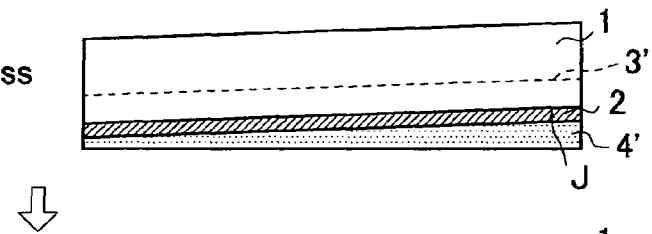
Figure 2:
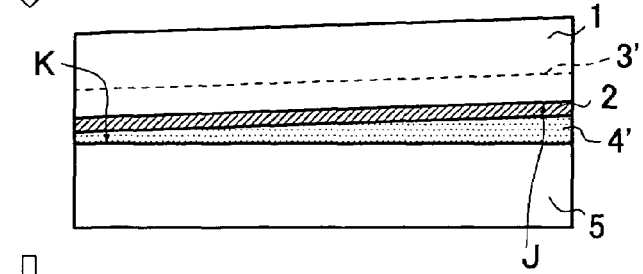
Figure 2:
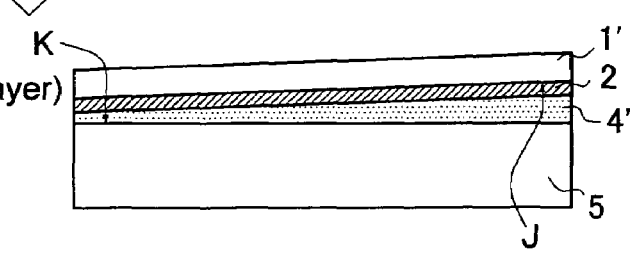

In FIG. 2, there are shown process views describing a manufacturing method of a bonded wafer related to Example 2 of this invention with a manufacturing method of an SOI wafer as an example. A manufacturing method of a bonded wafer related to Example 2 is simply the same as the manufacturing method of a bonded wafer related to Example 1 shown in FIG. 1, except that the base wafer 5 with the insulating film 6 is replaced by the base wafer 5 without an insulating film. Therefore, since steps (a2) to (d2) are the same as the corresponding steps (a1) to (d1) in FIG. 1, no detailed description is given of the steps (a2) to (d2).

(e2) Bonding Step

A base wafer 5, which is a single crystal silicon substrate, is prepared. As the base wafer 5, different kinds of substrates can also be used: for example, an insulating substrate such as a quartz substrate or a sapphire substrate, or alternatively, a compound semiconductor substrate such as a substrate of GaAs, InP or SiC, while it is preferable to use a single crystal silicon substrate in consideration of trends toward a larger diameter and a lower cost. The base wafer 5 that has been thus prepared is bonded at room temperature to the additional functional layer 4' on the bond wafer 1 on which ion implantation is applied on the first main surface K side.

(f2) Delamination Step

The stack obtained in the bonding step (e2) is heated to a temperature of hundreds of ° C. or higher: for example, a low temperature in the range of 400 to 600° C. to force delamination in the bond wafer 1 approximately at a position having the concentration peak in the delamination ion implantation layer 3' and to form an SOI layer 1' in a portion remaining on the base wafer 5 side. Since the delamination position is, as has been described, determined in the first ion implantation step (a2) as the delamination-intended ion implantation layer 3, the delamination position is not influenced by non-uniformity of a film thickness caused by the subsequent deposition of the additional function layer 4 and planarization polishing. In FIG. 2(f2), there is shown a state where a film thickness is uniform in the SOI layer 1' since the bond wafer 1 is delaminated at the delamination ion implantation layer 3', though a film thickness is non-uniform in the additional function layer 4'. Note that there is a case where a delaminating annealing can be omitted by increasing a dosage of ion implantation during formation of the delamination ion implantation layer 3'. A remaining portion of the bond wafer 1 after the delamination can be reused as a bond wafer or a base wafer after the delamination surface is repolished.

Note that the method that is described in the reference art may be adopted as the bonding step (e2) and the delamination step (f2). That is, it is also allowed that bonding is conducted after activation with a plasma of the surface of the additional function layer 4' of the bond wafer 1 and/or the surface of the base wafer 5, which has been conducted before bonding, and thereafter, water laser or gas is blown onto the bond wafer 1 without heating to thereby conduct delamination.

In the manufacturing method of a bonded wafer related to Example 2 as well, a film thickness of a bonded semiconductor thin layer (SOI layer 1') obtained by ion implantation delamination can be uniformed, regardless of a level of non-uniformity of a film thickness of the additional function layer 4' in a similar manner to that in the manufacturing method of a bonded wafer related to Example 1.

Embodiments of this invention have been described above, to which, however, this invention is not limited to them, and various alterations or improvements can be implemented in this invention as far as those do not fall outside the technical scope defined based on descriptions in claims. Especially while a manufacturing method of an SOI wafer has been described as an example of a manufacturing method of a bonded wafer, it is needless to say that a bonded semiconductor thin layer obtained by ion implantation delamination is not limited to an SOI layer made of a silicon thin film.

What is claimed is:

1. A manufacturing method of a bond wafer comprising:
    a first ion implantation step of conducting first ion implantation on a bond wafer so that a concentration peak of ion implantation is located at a position with a predetermined depth in an ion implantation profile in a depth direction from the surface of the bond wafer;
    an additional function layer deposition step of depositing an additional function layer on a ion implantation surface side of the bond wafer;
    a second ion implantation step of conducting second implantation through the additional function layer with the first ion implantation position as a target from the additional function layer side of the bond wafer;
    a bonding step of bonding the additional function layer side of the bond wafer to a base wafer; and
    a delamination step of separating the bond wafer off at the position of the first ion implantation, wherein
    the additional function layer is made of one of a polysilicon layer and an amorphous silicon layer.

2. The manufacturing method of a bonded wafer according to claim 1, wherein the first ion implantation adopts an ion implantation dosage causing no cracking in the bond wafer in a course of a thermal history in growth of the additional function layer.

3. The manufacturing method of a bonded wafer according to claim 1, wherein a dosage of first ion implantation in the first ion implantation step is larger than a dosage of second ion implantation in the second ion implantation step.

4. The manufacturing method of a bonded wafer according to claim 3, wherein a dosage of ion implantation in the first ion implantation is in the range of 70% or more and 90% or less of the critical dosage.

5. The manufacturing method of a bonded wafer according to claim 1, comprising: a planarization polishing step either one of before and after the second ion implantation step wherein the surface of the deposited additional function layer is planarized by polishing.

6. The manufacturing method of a bonded wafer according to claim 1, comprising: an activation step of activating surfaces of one or both of the bond wafer and the base wafer with a plasma before the bonding step.

7. The manufacturing method of a bonded wafer according to claim 6, wherein the delamination step is a step of conducting delamination by blowing one of water laser and gas to the bond wafer after the activation step.

8. The manufacturing method of a bonded wafer according to claim 1, wherein the delamination step is a step of conducting delamination by heat treating the bond wafer.

9. The manufacturing method of a bonded wafer according to claim 1, wherein the ion is one selected from a hydrogen ion, a helium ion, a neon ion, an argon ion, a krypton ion and a xenon ion.

10. A manufacturing method of a bonded wafer comprising:
    a first ion implantation step of forming a delamination-intended ion implantation layer having a concentration peak of ion implantation at a position having a predetermined depth in an ion implantation profile in a depth direction in the bond wafer by implanting ions at a dosage less than a critical dosage from the insulating film side of the bond wafer forming a single crystal silicon substrate having an insulating film;

an additional function layer deposition step of depositing an additional function layer on the insulating film of the bond wafer;

a second ion implantation step of forming a delamination ion implantation layer from the delamination-intended ion implantation layer by implanting ions through the additional functional layer at a dosage amounting to more than a critical dosage including the dosage of ion implantation in the first ion implantation step as a total dosage, so that ion implantation is conducted at the same position of depth of ion implantation as in the first ion implantation step from the surface side of the additional function layer;

a bonding step of bonding the additional function layer on the bond wafer wherein the delamination ion implantation layer is formed to a base wafer; and a delamination step of separating the bond wafer off at the delamination ion implantation layer, wherein the additional function layer is made of one of a polysilicon layer and an amorphous silicon layer.

11. The manufacturing method of a bonded wafer according to claim 10, wherein the insulating film is one selected from a silicon oxide film, a silicon nitride film and a silicon oxide nitride film.

12. A manufacturing method of a bonded wafer according to claim 10, wherein the base wafer is one selected from a single crystal silicon substrate having an insulating film, a single crystal silicon substrate, an insulating substrate and a compound semiconductor substrate.

13. The manufacturing method of a bonded wafer according to claim 10, wherein a dosage of first ion implantation in the first ion implantation step is larger than a dosage of second ion implantation in the second ion implantation step.

14. The manufacturing method of a bonded wafer according to claim 13, wherein a dosage of ion implantation in the first ion implantation is in the range of 70% or more and 90% or less of the critical dosage.

15. The manufacturing method of a bonded wafer according to claim 10, comprising: a planarization polishing step either one of before and after the second ion implantation step wherein the surface of the deposited additional function layer is planarized by polishing.

16. The manufacturing method of a bonded wafer according to claim 10 comprising: an activation step of activating surfaces of one or both of the bond wafer and the base wafer with a plasma before the bonding step.

17. The manufacturing method of a bonded wafer according to claim 16, wherein the delamination step is a step of conducting delamination by blowing one of water laser and gas to the bond wafer after the activation step.

18. The manufacturing method of a bonded wafer according to claim 10, wherein the delamination step is a step of conducting delamination by heat treating the bond wafer.

19. The manufacturing method of a bonded wafer according to claim 10, wherein the ion is one selected from a hydrogen ion, a helium ion, a neon ion, an argon ion, a krypton ion and a xenon ion.

* * * * *

UNITED STATES PATENT AND TRADEMARK OFFICE
CERTIFICATE OF CORRECTION

PATENT NO. : 7,601,613 B2  Page 1 of 1
APPLICATION NO. : 11/629074
DATED : October 13, 2009
INVENTOR(S) : Kiyoshi Mitani It is certified that error appears in the above-identified patent and that said Letters Patent is hereby corrected as shown below:

Title page, delete the following item:

"(22) PCT Filed:    June 6, 2005"

and Replace with:

(22) PCT Filed:    June 10, 2005

Signed and Sealed this

Twenty-ninth Day of June, 2010

David J. Kappos
*Director of the United States Patent and Trademark Office*